(12) United States Patent
Fujiwara et al.

(10) Patent No.: US 12,260,897 B2
(45) Date of Patent: Mar. 25, 2025

(54) SEPARATED READ BL SCHEME IN 3T DRAM FOR READ SPEED IMPROVEMENT

(71) Applicant: Taiwan Semiconductor Manufacturing Company, Ltd., Hsinchu (TW)

(72) Inventors: Hidehiro Fujiwara, Hsin-chu (TW); Yi-Hsun Chiu, Zhubei (TW); Yih Wang, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 424 days.

(21) Appl. No.: 17/870,208

(22) Filed: Jul. 21, 2022

(65) Prior Publication Data

US 2022/0358992 A1 Nov. 10, 2022

Related U.S. Application Data

(62) Division of application No. 17/085,287, filed on Oct. 30, 2020, now Pat. No. 11,482,276.

(51) Int. Cl.
*G11C 11/408* (2006.01)
*G11C 11/4097* (2006.01)
*H10B 12/00* (2023.01)

(52) U.S. Cl.
CPC ...... *G11C 11/4085* (2013.01); *G11C 11/4097* (2013.01); *H10B 12/00* (2023.02)

(58) Field of Classification Search
CPC .. G11C 11/4085; G11C 11/4097; H10B 12/00
USPC ........................................................ 365/149
See application file for complete search history.

(56) References Cited

U.S. PATENT DOCUMENTS

| | | | |
|---|---|---|---|
| 5,995,433 | A | 11/1999 | Liao et al. |
| 6,016,268 | A | 1/2000 | Worley |
| 6,121,079 | A | 9/2000 | Kim |
| 6,307,788 | B1 | 10/2001 | Tanaka |
| 6,421,265 | B1 | 7/2002 | Lien et al. |
| 8,009,466 | B2 | 8/2011 | Sakimura et al. |
| 10,032,777 | B1 * | 7/2018 | Chen .................. G11C 11/4097 |
| 10,755,766 | B2 | 8/2020 | Hush |
| 10,958,272 | B2 | 3/2021 | Shu et al. |

(Continued)

FOREIGN PATENT DOCUMENTS

| | | |
|---|---|---|
| TW | 297128 B | 2/1997 |
| TW | 200836192 A | 9/2008 |

OTHER PUBLICATIONS

Foreign Action other than Search Report on TW110106736 Dtd Oct. 7, 2021.

(Continued)

*Primary Examiner* — Connie C Yoha
(74) *Attorney, Agent, or Firm* — FOLEY & LARDNER LLP

(57) ABSTRACT

A memory device includes a memory array having a first memory cell in a first column of the memory array, a second memory cell in the first column of the memory array, a first read bit line extending in a column direction and connected to the first memory cell to read data from the first memory cell, and a second read bit line extending in the column direction and connected to the second memory cell to read data from the second memory cell.

20 Claims, 9 Drawing Sheets

(56) References Cited

U.S. PATENT DOCUMENTS

| | | |
|---|---|---|
| 11,018,137 B2 * | 5/2021 | Hwang .................. H10B 12/01 |
| 2004/0090857 A1 | 5/2004 | Watanabe et al. |
| 2005/0047218 A1 | 3/2005 | Kirihata et al. |
| 2015/0279453 A1 | 10/2015 | Fujiwara et al. |
| 2020/0075081 A1 | 3/2020 | Hush |
| 2020/0301605 A1 | 9/2020 | Ramesh |
| 2021/0012833 A1 | 1/2021 | Li et al. |

OTHER PUBLICATIONS

Non-Final Office Action on U.S. Appl. No. 17/085,287 Dtd Mar. 7, 2022.
Notice of Allowance on U.S. Appl. No. 17/085,287 Dtd Jun. 30, 2022.
US Office Action on U.S. Appl. No. 17/085,287 Dtd Jul. 22, 2021.
Office Action issued in connection with Chinese Appl. No. 202110210088.X dated Dec. 19, 2024.

* cited by examiner

SEPARATED READ BL SCHEME IN 3T DRAM FOR READ SPEED IMPROVEMENT

CROSS-REFERENCE TO RELATED PATENT APPLICATIONS

This application is a divisional of U.S. application Ser. No. 17/085,287, filed on Oct. 30, 2020, the entirety of which is incorporated by reference herein.

BACKGROUND

The present disclosure relates generally to signal routing, and particularly to signal routing on a back side of a semiconductor substrate.

Memory devices are used in a wide variety of applications. Memory devices are made up of a plurality of memory cells that are typically arranged in an array of a plurality of rows and a plurality of columns. One type of memory cell is a Dynamic Random Access Memory (DRAM) cell. In some applications, a DRAM cell-based memory device may be preferred over other types of memory cell-based memory devices due to DRAM cell's lower cost, smaller area, and ability to hold more data compared to, for example, a Static Random Access Memory (SRAM) cell. As applications require more and more memory, the number of DRAM cells in a memory device is constantly increasing. Additionally, with rising demand for product diversification, co-operation between circuit design and semiconductor manufacturing of DRAM memories is becoming more and more crucial. However, present day DRAM memories have limitations in the way those memories are configured and how they operate.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
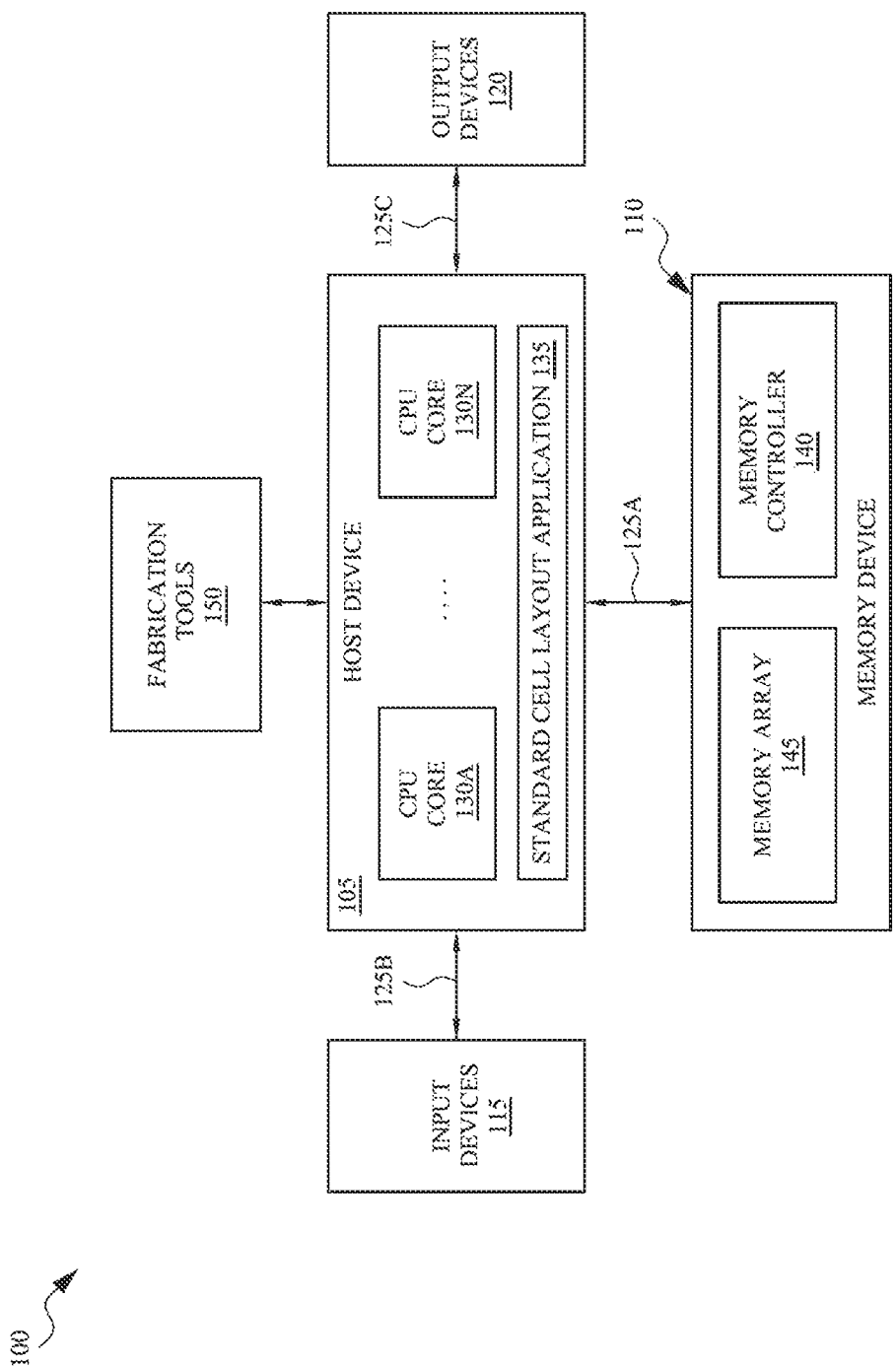
FIG. 1 is an example block diagram of a computing system, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Referring now to FIG. 1, an example block diagram of a computing system 100 is shown, in accordance with some embodiments of the disclosure. The computing system 100 may be used by a circuit or layout designer for performing a standard cell layout of a circuit. A "circuit" or "integrated circuit" as used herein is an interconnection of electrical components such as resistors, transistors, switches, batteries, inductors, or other types of semiconductor devices configured for implementing a desired functionality. The computing system 100 includes a host device 105 associated with a memory device 110. The host device 105 may be configured to receive input from one or more input devices 115 and provide output to one or more output devices 120. The host device 105 may be configured to communicate with the memory device 110, the input devices 115, and the output devices 120 via appropriate interfaces 125A, 125B, and 125C, respectively. The computing system 100 may be implemented in a variety of computing devices such as computers (e.g., desktop, laptop, servers, data centers, etc.), tablets, personal digital assistants, mobile devices, other handheld or portable devices, or any other computing unit suitable for performing standard cell layout using the host device 105.

The input devices 115 may include any of a variety of input technologies such as a keyboard, stylus, touch screen, mouse, track ball, keypad, microphone, voice recognition, motion recognition, remote controllers, input ports, one or more buttons, dials, joysticks, and any other input peripheral that is associated with the host device 105 and that allows an external source, such as a user (e.g., a circuit or layout designer), to enter information (e.g., data) into the host device and send instructions to the host device. Similarly, the output devices 120 may include a variety of output technologies such as external memories, printers, speakers, displays, microphones, light emitting diodes, headphones, video devices, and any other output peripherals that are configured to receive information (e.g., data) from the host device 105. The "data" that is either input into the host device 105 and/or output from the host device may include any of a variety of textual data, circuit data, signal data, semiconductor device data, graphical data, combinations thereof, or other types of analog and/or digital data that is suitable for processing using the computing system 100.

The host device 105 includes or is associated with one or more processing units/processors, such as Central Processing Unit ("CPU") cores 130A-130N. The CPU cores 130A-130N may be implemented as an Application Specific Integrated Circuit ("ASIC"), Field Programmable Gate Array ("FPGA"), or any other type of processing unit. Each of the CPU cores 130A-130N may be configured to execute instructions for running one or more applications of the host device 105. In some embodiments, the instructions and data needed to run the one or more applications may be stored within the memory device 110. The host device 105 may also be configured to store the results of running the one or more applications within the memory device 110. Thus, the host device 105 may be configured to request the memory device 110 to perform a variety of operations. For example, the host device 105 may request the memory device 110 to read data, write data, update or delete data, and/or perform management or other operations.

One such application that the host device 105 may be configured to run may be a standard cell layout application 135. The standard cell layout application 135 may be part of a computer aided design or electronic design automation software suite that may be used by a user of the host device 105 to create a standard cell layout (also referred to herein as "layout," "layout diagram," "layout design," and the like) of a circuit. A standard cell layout of the circuit may show various components and connections of the circuit to be fabricated. For example, the standard cell layout may show one or more active regions, gate electrodes, source and drain electrodes, metal lines, via contacts, openings for bonding pads, one or more metal layers, power sources, input and output signals, clock signals, etc. representing the various components of the circuit, and how those components are interconnected when disposed in/on a semiconductor substrate (such as a silicon wafer). The standard cell layout may be implemented by following a design procedure that may include one or more of logic design, physical design, or place and route. The standard cell layout may be expressed in one or more data files such as GDSII file format or DFII file format. In other embodiments, other file formats may be used. Thus, using the standard cell layout application 135, a circuit designer may create a standard cell layout of a circuit. In some embodiments, the instructions needed to execute or run the standard cell layout application 135 may be stored within the memory device 110. The standard cell layout application 135 may be executed by one or more of the CPU cores 130A-130N using the instructions associated with the standard cell layout application from the memory device 110.

Referring still to FIG. 1, the memory device 110 includes a memory controller 140 that is configured to read data from or write data to a memory array 145. In some embodiments, the memory array 145 may include a variety of volatile and/or non-volatile memories. For example, in some embodiments, the memory array 145 may include NAND flash memory cores, NOR flash memory cores, Static Random Access Memory (SRAM) cores, Dynamic Random Access Memory (DRAM) cores, Magnetoresistive Random Access Memory (MRAM) cores, Phase Change Memory (PCM) cores, Resistive Random Access Memory (ReRAM) cores, 3D XPoint memory cores, ferroelectric random-access memory (FeRAM) cores, and other types of memory cores that are suitable for use within the memory array. Generally speaking, the memory array 145 may include any of a variety of Random Access Memory (RAM), Read-Only Memory (ROM), Programmable ROM (PROM), Erasable PROM (EPROM), Electrically EPROM (EEPROM), hard disk drives, flash drives, memory tapes, optical drives, cloud memory, or any combination of primary and/or secondary memory that is suitable for performing the operations described herein.

The memories within the memory array 145 may be individually and independently controlled by the memory controller 140. In other words, the memory controller 140 may be configured to communicate with each memory within the memory array 145 individually and independently. By communicating with the memory array 145, the memory controller 140 may be configured to read data from or write data to the memory array in response to instructions received from the host device 105. Although shown as being part of the memory device 110, in some embodiments, the memory controller 140 may be part of the host device 105 or part of another component of the computing system 100 and associated with the memory device. The memory controller 140 may be implemented as a logic circuit in either software, hardware, firmware, or combination thereof to perform the functions described herein. For example, in some embodiments, the memory controller 140 may be configured to retrieve the instructions associated with the standard cell layout application 135 stored in the memory array 145 of the memory device 110 upon receiving a request from the host device 105.

In some embodiments, the computing system 100 may also be associated with various fabrication tools 150. Among other things, the fabrication tools 150 may be used to prepare and fabricate a set of masks based on the standard cell layout created by the standard cell layout application 135. The set of masks may define the geometry for the photolithography steps used during semiconductor fabrication of the circuit. Although the fabrication tools 150 are shown separate from the host device 105, in some embodiments, at least some of the functionality of the fabrication tools may be implemented by the host device such as by the standard cell layout application 135 or another application associated with the standard cell layout application.

To prepare a set of masks, the fabrication tools 150 may be used to translate the standard cell layout of the circuit into a representative data file ("RDF"). The RDF may then be used to fabricate a set of physical masks to fabricate the circuit.

In some embodiments, preparing the set of masks may include performing an optical proximity correction ("OPC") using lithography enhancement techniques to compensate for image errors, such as those that can arise from diffraction, interference, other process effects and the like, in the standard cell layout. In some embodiments, a mask rule checker ("MRC") of the fabrication tools 150 may check the standard cell layout that has undergone processes in OPC with a set of mask creation rules. The mask creation rules may contain certain geometric and/or connectivity restrictions to ensure sufficient margins, to account for variability in semiconductor manufacturing processes, and the like. In some embodiments, the MRC may modify the standard cell layout to compensate for limitations during the fabrication of the set of masks. In some embodiments, preparing the set of masks may also include resolution enhancement techniques ("RET"), such as off-axis illumination, sub-resolution assist features, phase-shifting masks, other suitable techniques, and the like or combinations thereof.

The preparation of the set of masks may further include, in some embodiments, lithography process checking ("LPC") that may simulate processes implemented to fabricate the circuit. LPC may simulate these processes based on the standard cell layout to create a simulated manufactured device of the circuit. LPC may take into account various factors, such as aerial image contrast, depth of focus ("DOF"), mask error enhancement factor ("MEEF"), other suitable factors, and the like or combinations thereof, to simulate the fabrication of the circuit. In some embodiments, after a simulated manufactured device has been created by LPC, if the simulated device does not satisfy certain design rules, OPC and/or MRC may be repeated to further refine the standard cell layout.

To fabricate the set of masks, a mask writer may convert the RDF to an image on a substrate, such as a mask (reticle) or a semiconductor wafer. In some embodiments, an electron-beam (e-beam) or a mechanism of multiple e-beams may be used to form a mask pattern on a semiconductor wafer to form the mask. In some embodiments, the mask pattern may include one or more opaque regions and one or more transparent regions. A radiation beam, such as an ultraviolet ("UV") beam, used to expose the image sensitive material layer (e.g., photoresist) which has been coated on the semiconductor wafer, may be blocked by the opaque regions and transmits through the transparent regions. In one example, the mask pattern may include a transparent substrate (e.g., fused quartz) and an opaque material (e.g., chromium) coated in the opaque regions to form the mask. In other embodiments, other or additional techniques may be used to fabricate the masks.

Once the masks are fabricated, a fabrication entity (e.g., a manufacturing facility or semiconductor foundry) may use the fabricated masks to fabricate the circuit. In some embodiments, fabricating the circuit may involve depositing one or more material in/on a semiconductor wafer using the mask (or masks). The semiconductor wafer may include a silicon substrate or other substrate having material layers formed thereon. The semiconductor wafer may further include one or more of various doped regions, dielectric features, multilevel interconnects, and the like formed using one or more of the masks.

It is to be understood that although the fabrication tools 150 are described as performing certain operations for preparing the set of masks and then fabricating the set of masks, in some embodiments, the various processes may vary from those described. In some embodiments, additional or other processes or operations may be used to prepare the set of masks and fabricate the set of masks. It is also to be understood that only some components of the computing system 100 are shown and described in FIG. 1. However, the computing system 100 may include other components such as various batteries and power sources, networking interfaces, routers, switches, external memory systems, controllers, etc. Generally speaking, the computing system 100 may include any of a variety of hardware, software, and/or firmware components that are needed or considered desirable in performing the functions described herein. Similarly, the host device 105, the input devices 115, the output devices 120, and the memory device 110 including the memory controller 140 and the memory array 145 may each include other hardware, software, and/or firmware components that are considered necessary or desirable in performing the functions described herein.

Figure 2:
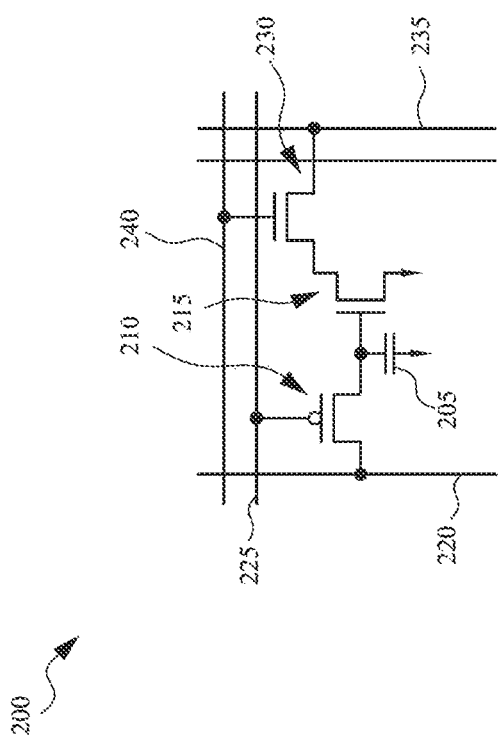
FIG. 2 is an example circuit diagram of a three transistor (3T) Dynamic Random Access Memory (DRAM) cell, in accordance with some embodiments.

Turning to FIG. 2, an example circuit diagram of a 3-transistor or 3T Dynamic Random Access Memory (DRAM) cell 200 is shown, in accordance with some embodiments of the present disclosure. The 3T DRAM cell 200 includes a storage capacitor 205, a first plate of which is connected to a first terminal (e.g., source terminal) of a write pass gate transistor 210 and a first terminal (e.g., gate terminal) of a read pull down transistor 215, while a second plate of which is connected to ground. A second terminal (e.g., drain terminal) of the write pass gate transistor 210 is connected to a write bit line 220 and a third terminal (e.g., gate terminal) of the write pass gate transistor is connected to a write word line 225. A second terminal (e.g., source terminal) of the read pull down transistor 215 is connected to ground, while a third terminal (e.g., drain terminal) of the read pull down transistor is connected to a first terminal (e.g., source terminal) of a read pass gate transistor 230. A second terminal (e.g., drain terminal) of the read pass gate transistor 230 is connected to a read bit line 235, while a third terminal (e.g., gate terminal) of the read pass gate transistor is connected to a read word line 240. In some embodiments, each of the write pass gate transistor 210, the read pull down transistor 215, and the read pass gate transistor 230 is an n-type transistor. In other embodiments, one or more of the write pass gate transistor 210, the read pull down transistor 215, and the read pass gate transistor 230 may be a p-type transistor, as discussed in alternate configurations of FIGS. 6A-6C below.

The write pass gate transistor 210 may be used to store or write data (e.g., charge) within the storage capacitor 205, while the read pull down transistor 215 and read pass gate transistor 230 may be used to read data (e.g., charge) stored within the storage capacitor. To write data to the storage capacitor 205, the write pass gate transistor 210 may be turned on by applying appropriate voltage at the write word line 225 and the data to be stored within the storage capacitor may be applied to the write bit line 220. When the write pass gate transistor 210 is turned on, the data applied to the write bit line 220 is stored within the storage capacitor 205. To read data from the storage capacitor 205, the read pass gate transistor 230 may be turned on by applying appropriate voltage at the read word line 240 and the data to be read from the storage capacitor may be read from the read bit line 235. When the storage capacitor 205 stores logic 1 data, the read pull down transistor 215 is turned on and when the read pass gate transistor 230 is turned on, the read pull down transistor pulls down the read bit line 235 to ground (e.g., since the read pull down transistor is connected to ground) to read an inverse of the data stored in the storage capacitor. When the storage capacitor 205 stores logic 0 data, the read pull down transistor 215 remains turned off and even with the read pass gate transistor 230 turned on, the read bit line remains unchanged and maintains the previous state (e.g., pre-charged state).

Although the DRAM cell 200 is described herein as a 3T DRAM cell, in other embodiments, the DRAM cell 200 may assume other configurations. For example, in some embodiments, the DRAM cell 200 may be a 4T DRAM cell, 8T DRAM cell, 10T DRAM cell, 12T DRAM cell, etc. In other embodiments, the DRAM cell 200 may include any other number of transistors. Further, the configuration of the DRAM cell 200 may vary in other embodiments. For example, the write pass gate transistor 210, the read pull down transistor 215, and the read pass gate transistor 230 may be connected in different ways.

Figure 3:
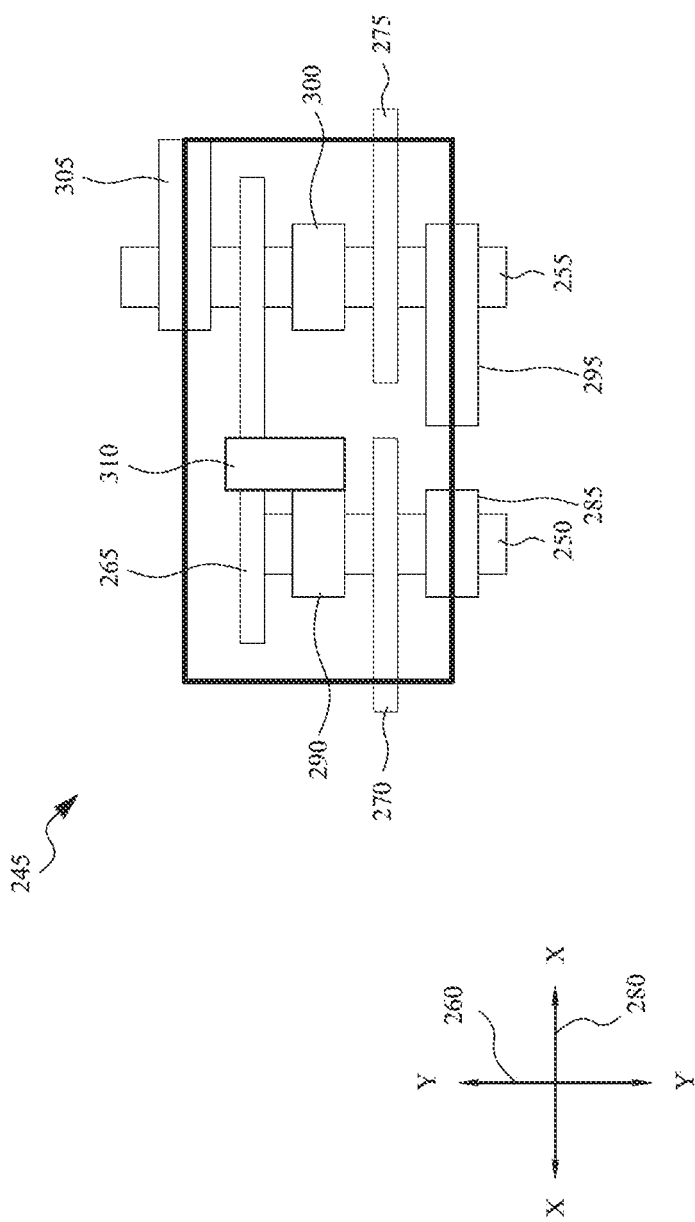
FIG. 3 is an example layout of the DRAM cell of FIG. 2, in accordance with some embodiments.

Referring to FIG. 3, an example layout design 245 of the 3T DRAM cell 200 is shown, in accordance with some embodiments of the present disclosure. The layout design 245 may define features of active devices (e.g., the write pass gate transistor 210, the read pull down transistor 215, the read pass gate transistor 230, the storage capacitor 205) of the DRAM cell 200 along an active region. An "active region" may be a fin-shaped region of one or more three-dimensional field-effect-transistors (e.g., FinFETs, gate-all-around (GAA) transistors including nanosheet transistors and nanowire transistors), or an oxide-definition (OD) region of one or more planar metal-oxide-semiconductor field-effect-transistors (MOSFETs). The active region may define source or drain terminals of the active devices (e.g., the transistors, storage capacitor noted above). Gate terminals of those transistor may be defined by gate structures, which may be formed of one or more conductive materials (e.g., polysilicon(s), metal(s)), and may overlay respective portions of the active region to define the write pass gate transistor 210, the read pull down transistor 215, and the read pass gate transistor 230.

For example, the layout design 245 shows active regions 250 and 255, which define the source and drain regions of the write pass gate transistor 210, the read pull down transistor 215, and the read pass gate transistor 230. In some embodiments, the active regions 250 and 255 may extend in a Y-direction 260. The layout design 245 also shows gate structures 265, 270, and 275 overlaying the active regions 250 and/or 255 and defining the gate terminals of the write pass gate transistor 210, the read pull down transistor 215, and the read pass gate transistor 230. In some embodiments, the gate structures 265-275 extend in an X-direction 280. In some embodiments, the active regions 250, 255 may extend in the X-direction 280 and the gate structures 265-275 may extend in the Y-direction 260. Portions of the active regions 250, 255 that are disposed on either side of a respective one of the gate structures 265-275 may define the source and drain terminal of the respective transistor (e.g., the write pass gate transistor 210, the read pull down transistor 215, and the read pass gate transistor 230).

Thus, for example, the gate structure 270 overlaying the active region 250 defines the gate terminal of the write pass gate transistor 210, while the portions of that active region on either side of that gate structure define the source and drain terminals of the write pass gate transistor. In some embodiments, the source and drain terminals of the write pass gate transistor 210 may be connected to other connections (e.g., source and drain terminals of other transistors) through local interconnect (e.g., LC0) 285 and 290. For example, the local interconnect 290 may be used to connect the source terminal of the write pass gate transistor 210 to the storage capacitor 205.

The gate structure 275 overlaying the active region 255 defines the gate terminal of the read pass gate transistor 230, with the portions of the active region on either side of that gate structure defining the source and drain terminals of the read pass gate transistor. In some embodiments, the source and drain terminals of the read pass gate transistor 230 may be connected to other connections (e.g., source and drain terminals of other transistors) through local interconnect layer (e.g., LC0) 295 and 300. For example, the source terminal of the read pass gate transistor 230 may be connected to the drain terminal of the read pull down transistor 215 through the local interconnect layer 300. The gate structure 265 overlaying the active region 255 defines the gate terminal of the read pull down transistor 215, with the portion of the active region on either side of that gate structure defining the source and drain terminals of the read pull down transistor. In some embodiments, the source and drain terminals of the read pull down transistor 215 may be connected to other connections (e.g., source and drain terminals of other transistors) through the local interconnect layer (e.g., LC0) 300, as well as local interconnect layer (e.g., LC0) 305. For example, the drain terminal of the read pull down transistor 215 may be connected to the source terminal of the read pass gate transistor 230 through the local interconnect layer 300.

Local interconnect layer 310 (e.g., LC1) that connects the source terminal (e.g., the local interconnect 290) of the write pass gate transistor 210 and the gate structure 265 defines the storage capacitor 205. Additionally, the gate structures 270 and 275 defining the gate terminals of the write pass gate transistor 210 and the read pass gate transistor 230, respectively, may be connected to the write bit line 220, the write word line 225, the read bit line 235, and the read word line 240. The layout design of the write bit line 220, the write word line 225, the read bit line 235, and the read word line 240 is not shown in FIG. 2. In some embodiments, the connection between the gate structures 270 and 275 and the write bit line 220, the write word line 225, the read bit line 235, and the read word line 240 may be facilitated by electrically connecting those gate structures with an interconnect layer, such as a Metal 0 (e.g., M0), Metal 1 (e.g., M1) layer, etc. Such interconnect layers are described in greater detail below.

In some embodiments, the local interconnect layers 285, 290, 295, 300, 305 may each be used to connect the source/drain terminal of a respective transistor to another connection, and may include a conductive material, such as one or more metal materials, and may be formed using a local interconnect 0 or LC0 layer. Similarly, in some embodiments, the local interconnect layer 310 may be used to connect the source/drain terminal of a respective transistor to another connection, and may include a conductive material, such as one or more metal materials, and may be formed using a local interconnect 1 or LC1 layer. In some embodiments, the LC1 layer may be formed above an LC0 layer. In other words, the LC0 layer may be sandwiched between the LC1 layer and the active devices on the layout design 245. Further, in some embodiments, the LC1 layer may extend perpendicular to the LC0 layer. For example, in some embodiments, the LC0 layer may extend in the X direction 280, while the LC1 layer may extend in the Y direction 260.

Figure 4:
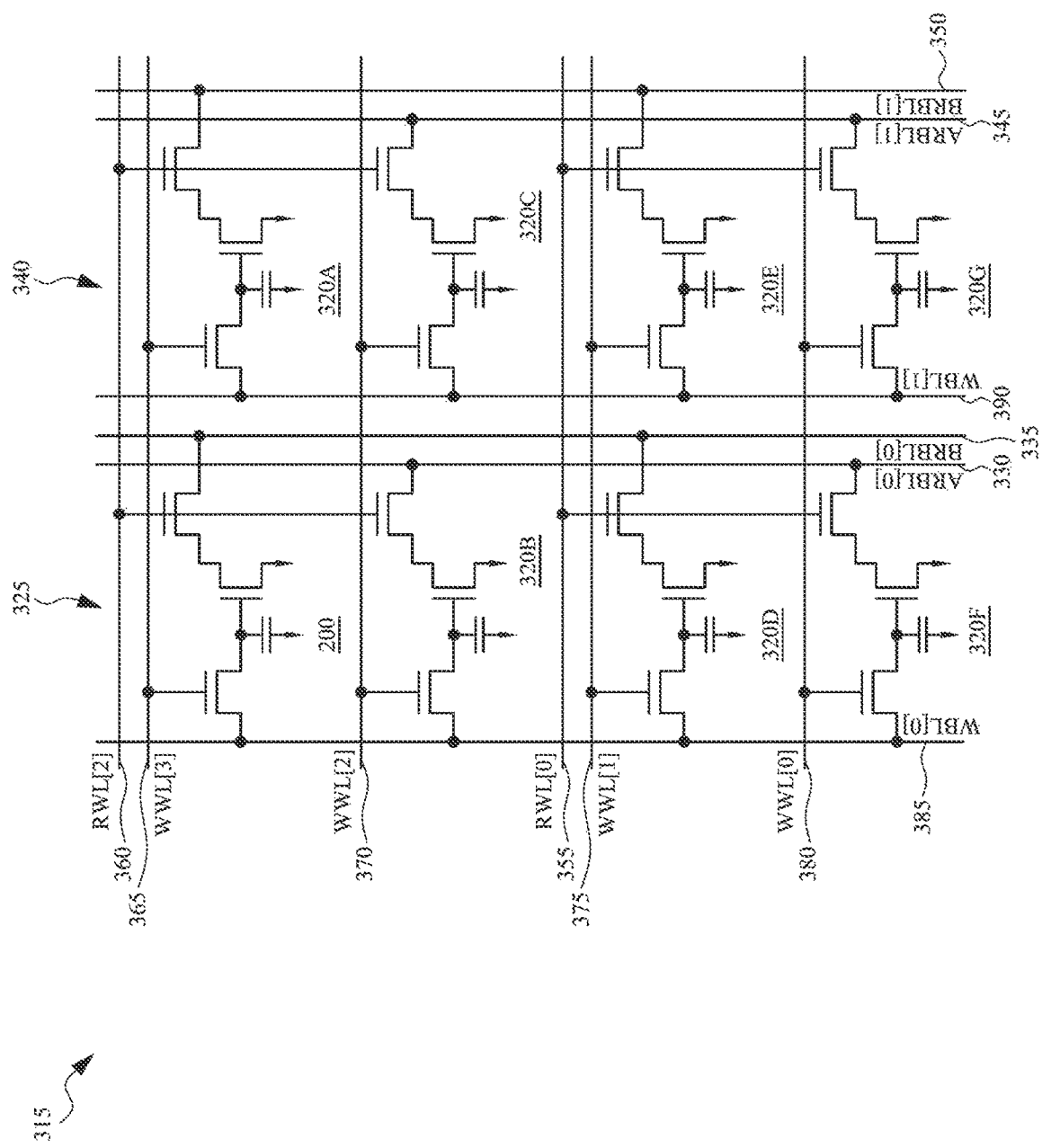
FIG. 4 is an example DRAM array, in accordance with some embodiments.

Turning now to FIG. 4, an example DRAM array 315 is shown, in accordance with some embodiments of the present disclosure. The DRAM array 315 includes the DRAM cell 200 and a plurality of additional DRAM cells 320A-320G arranged in an array of rows and columns. Each of the plurality of DRAM cells 320A-320G is similar to the DRAM cell 200, and therefore, not described again. Thus, similar to the DRAM cell 200, each of the plurality of DRAM cells 320A-320G includes a write pass gate transistor (e.g., the write pass gate transistor 210) connected to a storage capacitor (e.g., the storage capacitor 205), a read pull down transistor (e.g., the read pull down transistor 215) connected to the storage capacitor, and a read pass gate transistor (e.g., the read pass gate transistor 230) connected to the read pull down transistor in series. A terminal (e.g., the drain terminal) of the write pass gate transistor of the DRAM cell 200 and each of the plurality of additional DRAM cells 320A-320G may be connected to a write bit line (e.g., the write bit line 220) and a terminal of the read pass gate transistor of the DRAM cell and each of the plurality of additional DRAM cells may be connected to a read bit line (e.g., the read bit line 235). Further, a terminal (e.g., the gate terminal) of the write pass gate transistor and the read pass gate transistor of the DRAM cell and each of the plurality of additional DRAM cells 320A-320G in the DRAM array 315 may be connected to a write word line (e.g., the write word line 225) and a read word line (e.g., the read word line 240), respectively.

Each row of the DRAM array 315 extends in an X-direction (e.g., the X-direction 280), also referred to herein as a row direction, and each column of the DRAM array extends in a Y-direction (e.g., the Y-direction 260), also referred to herein as a column direction. In other embodiments, each row in the DRAM array 315 may extend in the Y-direction (e.g., the Y-direction 260), which may be the row direction, and each column may extend in the X-direction (e.g., the X-direction 260), which may be the column direction. In general, the row and column directions are perpendicular or substantially perpendicular to one another. Although two columns and four rows of DRAM cells are shown in the DRAM array 315, in other embodiments, the DRAM array may include greater than or fewer than four rows, and/or greater than or fewer than two columns. Generally speaking, a DRAM cell may be formed at an intersection of a row and a column. Further, each DRAM cell of the DRAM array 315 connected to a bit line and word line experiences a voltage drop (e.g., current-resistance drop or IR drop) due to current (I) flowing through those bit lines and word lines, as well as the metal resistance (R) offered by those bit lines and word lines. Depending upon the number of rows in the DRAM array 315, the DRAM cells that are farther away from a read/write block (not shown) experience a greater IR drop than DRAM cells that are closer to the read/write block. In some embodiments, the IR drop contributed by the bit line may be more significant than the IR drop contributed by the word line. Longer the bit line, greater is the IR drop for the DRAM cells farthest away from the read/write block. Further, due to the capacitance of the storage capacitor (e.g., the storage capacitor 205), the read current (Lai) in the read bit line (e.g., the read bit line 235) is smaller during read operations in the DRAM array 315 compared to read operations in other types of memory arrays (e.g., SRAM memory arrays). Due to smaller read current, read operations in the DRAM array 315 are slower than, for example, read operations in SRAM arrays.

To increase read speed in the DRAM array 315, the present disclosure provides a mechanism to reduce the impact of the capacitance of the storage capacitor 205 and increase the read current in the read bit line 235. In conventional DRAM arrays, a terminal (e.g., the drain terminal) of the read pass gate (e.g., the read pass gate 230) of each DRAM cell in a given column is connected to the same read bit line (e.g., the read bit line 235). The present disclosure provides a mechanism in which each column of the DRAM array 315 includes two read bit lines instead of a single read bit line of the conventional DRAM arrays. Specifically, instead of connecting the same read bit line to all the DRAM cells in each column, a first read bit line (e.g., ARBL) may be connected to a first subset of the DRAM cells in each column and a second read bit line (e.g., BRBL) may be connected to the remaining subset of the DRAM cells in each column, thereby cutting down capacitance in the read bit line significantly. For example, in some embodiments, if the first read bit line is connected to half the DRAM cells in each column and the second read bit line is connected to the other half of the DRAM cells in each column, the capacitance in each of the first read bit line and the second read bit line may be half of the capacitance experienced by a single read bit line that is connected to all of the DRAM cells in a column. In other words, each of the first read bit line and the second read bit line has half the capacitance of a single read bit line of the conventional DRAM arrays.

Thus, a first column 325 of the DRAM array 315 includes a first read bit line (ARBL) 330 and a second read bit line (BRBL) 335. Similarly, a second column 340 of the DRAM array 315 includes a first read bit line (ARBL) 345 and a second read bit line (BRBL) 350. Thus, each column of the DRAM array 315 includes two read bit lines instead a single read bit line of the conventional DRAM arrays. Further, the first read bit line 330 and the second read bit line 335 are connected to alternating DRAM cells in the first column 325, while the first read bit line 345 and the second read bit line 350 are connected to alternating DRAM cells in the second column 340. For example, in the first column 325, the first read bit line 330 is connected to the DRAM cells 320B and 320F, while the second read bit line 335 is connected to the DRAM cells 200 and 320D. Similarly, in the second column 340, the first read bit line 345 is connected to the DRAM cells 320C and 320G, while the second read bit line 350 is connected to the DRAM cells 320A and 320E. Thus, each column of the DRAM array 315 has two read bit lines, with each read bit line being connected to alternating cells in the respective column.

Further, in some embodiments, the read word line (e.g., the read word line 240) may be shared by two adjacent DRAM cells in a particular column. For example, in some embodiments, read word line 355 may be shared by the DRAM cells 320D and 320F in the first column 325 and by the DRAM cells 320E and 320G in the second column 340. Similarly, read word line 360 may be shared by the DRAM cells 200 and 320B in the first column 325 and by the DRAM cells 320A and 320C in the second column 340. In some embodiments, and as shown in FIG. 4, the DRAM cells that are connected to the same read word line are connected to different read bit lines. For example, the DRAM cells 320D and 320F are connected to the same read word line (e.g., the read word line 355). However, the DRAM cell 320D is connected to the second read bit line 335 and the DRAM cell 320F is connected to the first read bit line 330. By virtue of being connected to different read bit lines, even though both DRAM cells that are connected to a single read word line may be activated at the same time during a read operation, the data from each DRAM cell may be read on the separate read bit lines.

For example, when the read word line 355 is activated to turn the read pass gate transistor (e.g., the read pass gate transistor 230) on, the read pass gate transistor of both the DRAM cells 320D and 320F may be turned on, thereby enabling data to be read from each of those DRAM cells. However, since the DRAM cells 320D and 320F are connected to separate read bit lines, the data from those DRAM cells may be read from the read bit lines that are connected to those DRAM cells. For example, data from the DRAM cell 320D may be read from the second read bit line 335 and data from the DRAM cell 320F may be read from the first read bit line 330, thereby enabling two DRAM cells to be read simultaneously, thereby further increasing read speeds compared to conventional DRAM arrays in which each DRAM cell is connected to the same read bit line.

Further, in some embodiments, each DRAM cell in a particular column of the DRAM array 315 may be connected to a separate write word line. For example, in some embodiments, in the first column 325, the DRAM cell 200 may be connected to a write word line 365, the DRAM cell 320B may be connected to a write word line 370, the DRAM cell 320D may be connected to a write word line 375, and the DRAM cell 320F may be connected to a write word line 380. Similarly, in the second column 340, the DRAM cell 320A may be connected to the write word line 365, the DRAM cell 320C may be connected to the write word line 370, the DRAM cell 320E may be connected to the write word line 375, and the DRAM cell 320G may be connected to the write word line 380. Thus, a write word line may be shared across all DRAM cells in a particular row (e.g., in the row direction) of the DRAM array 315. Additionally, in some embodiments, each column of the DRAM array 315 may share a common write bit line, which extends in the column direction. For example, in some embodiments, each of the DRAM cells 200, 320B, 320D, and 320F in the first column 325 share a write bit line 385, while each of the DRAM cells 320A, 320C, 320E, and 320G in the second column 340 share a write bit line 390.

By providing two read bit lines in each column of the DRAM array 315 and by sharing the read word line by two consecutive DRAM cells in each column of the DRAM array, the capacitance in the read bit line is cut down by half in each column of the DRAM array compared to conventional DRAM arrays. Reduced capacitance in the read bit line causes the read current in the read bit line to increase, thereby increasing the read speed of read operations in the DRAM array 315 compared to conventional DRAM arrays.

Figure 5A:
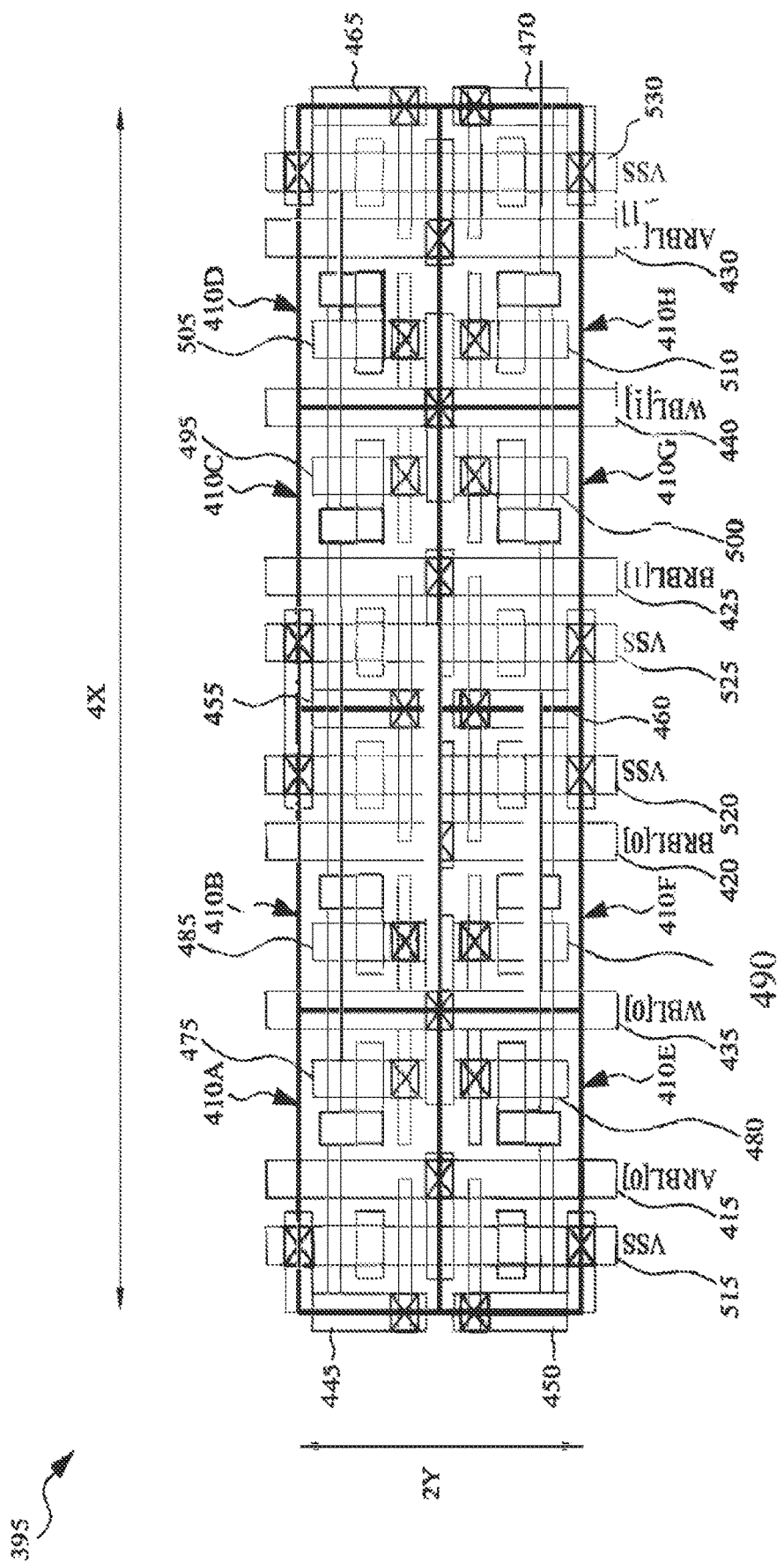
FIGS. 5A-5C are example layout diagrams of the DRAM array of FIG. 4, in accordance with some embodiments.
Figure 5B:
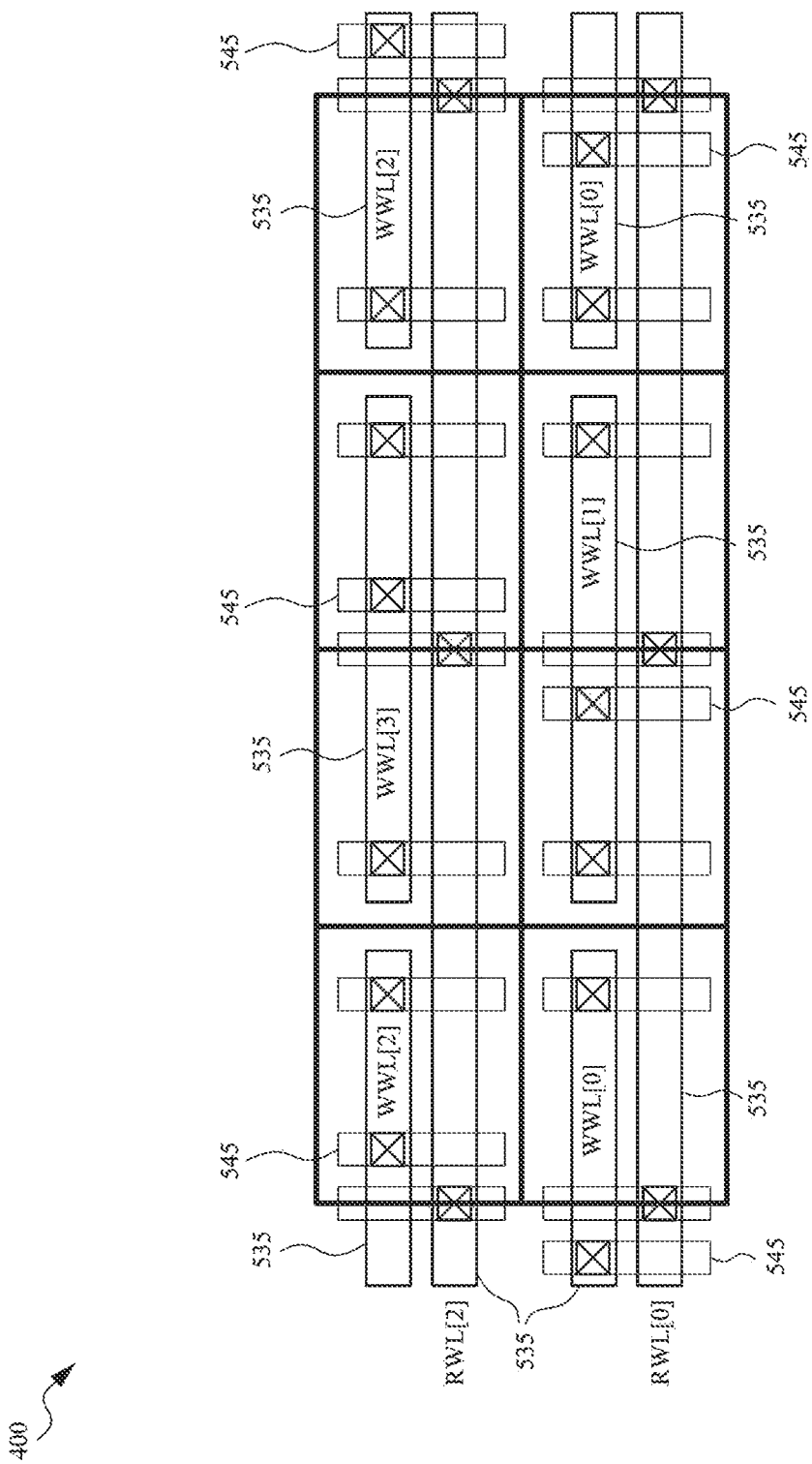
Figure 5C:
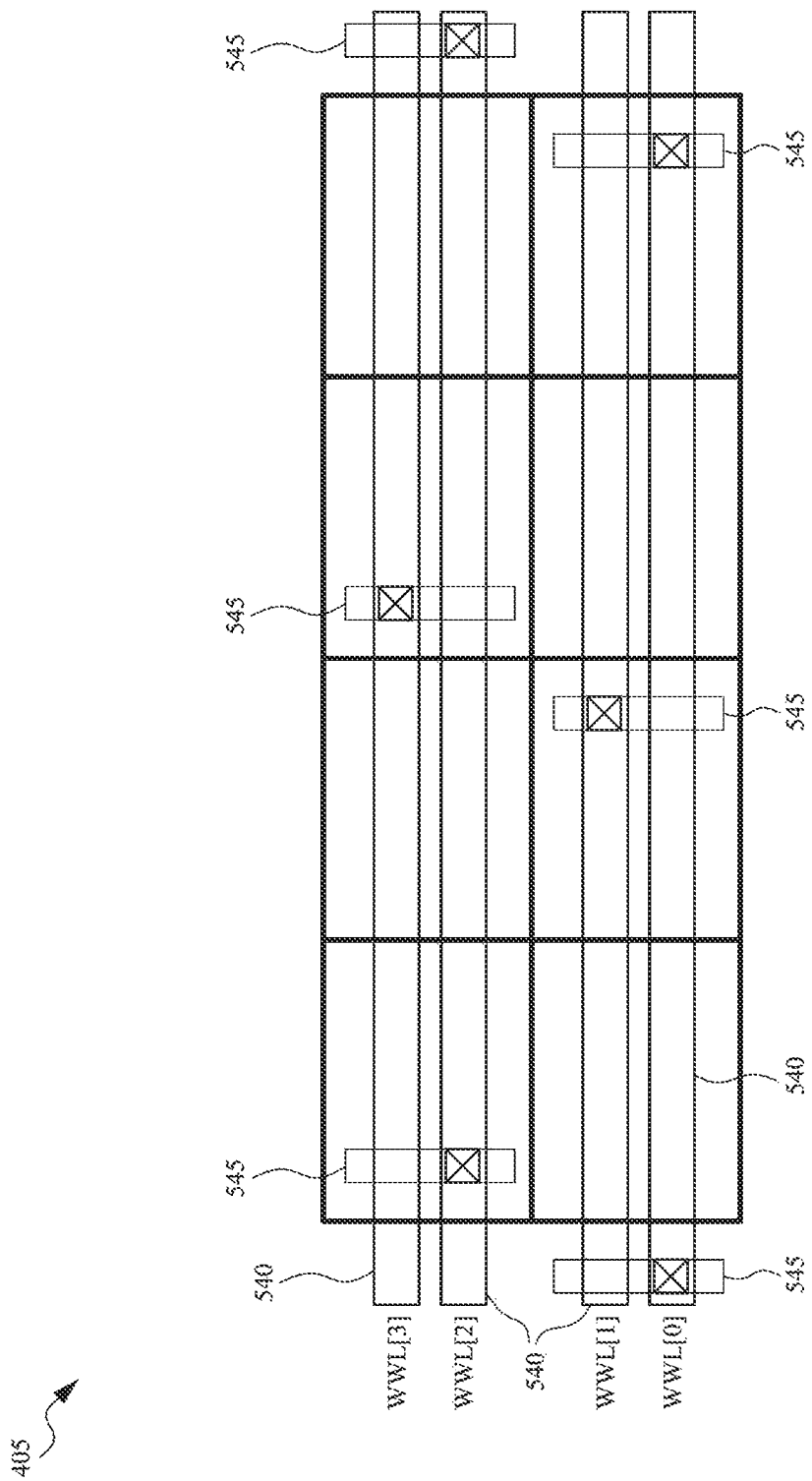

Referring to FIGS. 5A-5C, example layout designs of the DRAM array 315 are shown, in accordance with some embodiments of the present disclosure. Specifically, FIG. 5A shows a layout design 395 of the DRAM cells and the bit lines (e.g., the first read bit lines 330, 345 and the second read bit lines 335 and 350), FIG. 5B shows a layout design 400 of the read word lines 355 and 360, while FIG. 5C shows a layout design 405 of the write word lines 365, 370, 375, and 380. Referring specifically to FIG. 5A, the layout design 395 corresponds to the DRAM array 315. Therefore, the layout design 395 is a combination of layout designs 410A-410H in which the layout design 410A corresponds to the layout design of the DRAM cell 320B, the layout design 410E corresponds to the layout design of the DRAM cell 320F, the layout design 410B corresponds to the layout design of the DRAM cell 200, the layout design 410F corresponds to the layout design of the DRAM cell 320D, the layout design 410C corresponds to the layout design of the DRAM cell 320A, the layout design 410G corresponds to the layout design of the DRAM cell 320E, the layout design 410D corresponds to the layout design of the DRAM cell 320C, and the layout design 410H corresponds to the layout design of the DRAM cell 320G. Each of the layout designs 410A-410H is similar to the layout design 245, and therefore not described again.

The layout design 395 further shows that the layout designs 410A and 410E (corresponding to the DRAM cells 320B and 320F, respectively) share the first read bit line 330, which is represented by an interconnect layer 415, and the layout designs 410B and 410F (corresponding to the DRAM cells 200 and 320D, respectively) share the second read bit line 335, which is represented by an interconnect layer 420. Further, in some embodiments, the interconnect layer 420 may be shared by 2 DRAM cells in an M0 direction to save on routing tracks. The layout design 395 also shows that the layout designs 410C and 410G (corresponding to the DRAM cells 320A and 320E, respectively) share the second read bit line 350, which is represented by an interconnect layer 425, and the layout designs 410D and 410H (corresponding to the DRAM cells 320C and 320G, respectively) share the first read bit line 345, which is represented by an interconnect layer 430.

Additionally, an interconnect layer 435 represents the write bit line 385, which is shared by all DRAM cells (e.g., the DRAM cells 200, 320B, 320D, and 320F) in the first column 325 of the DRAM array 315 and an interconnect layer 440 represents the write bit line 390, which is shared by all DRAM cells (e.g., the DRAM cells 320A, 320C, 320E, and 320G) of the second column 340 of the DRAM array. Interconnect layers 445, 455, and 465 represent the read word line 360, while interconnect layers 450, 460, and 470 represent the read word line 355. The interconnect layer 455 is shared by the DRAM cells 200 and 320A, while the interconnect layer 460 is shared by the DRAM cells 320D and 320E. Interconnect layers 475 and 505 represent the write word line 370, the interconnect layers 480 and 510 represent the write word line 380, the interconnect layers 485 and 495 represent the write word line 365, and the interconnect layers 490 and 500 represent the write word line 375. Interconnect layers 515, 520, 525, and 530 represent the ground connection of the read pull down transistor of each DRAM cell in the DRAM array 315.

In some embodiments, each of the interconnect layers 415-530 may include a conductive material, such as one or more metal materials, and may be formed using a metal interconnect layer such as a Metal 0 (M0) layer, Metal 1 (M1) layer, Metal 2 (M2) layer, and so on. In some embodiments, the M0 layer may be formed immediately above gate structures (e.g., the gate structures 265, 270, 275) such that the M0 layer may be sandwiched between the M1 layer and those gate structures. Similarly, the M1 layer may be sandwiched between the M0 layer and an M2 layer that may be formed above the M1 layer. The M2 layer may be sandwiched between the M1 layer and an M3 layer, and so on. Further, in some embodiments, the M1 layer may extend perpendicular (or substantially perpendicular) to the M0 layer. For example, in some embodiments, the M0 layer may extend in the Y-direction 260, while the M1 layer may extend in the X-direction 280. Similarly, the M2 layer may extend in the Y-direction 260 to be perpendicular (or substantially perpendicular) to the M1 layer, and so on. In other embodiments, the various interconnect layers may extend in other directions.

Further, in some embodiments, the interconnect layers 415 (representing the first read bit line 330), 420 (representing the second read bit line 335), 425 (representing the second read bit line 350), 430 (representing the first read bit line 345), 435 (representing the write bit line 385), 440 (representing the write bit line 390), and 515-530 (representing the ground connection) may be formed at the M0 interconnect layer. The interconnect 435 representing the write bit line 385 may be shared by all DRAM cells in the first column 325 of the DRAM array 315. Similarly, the interconnect 440 representing the write bit line 390 may be shared by all DRAM cells in the second column 340 of the DRAM array 315.

In some embodiments, the interconnect layers 445-470 representing the read word lines 355 and 360 may be formed at an M1 interconnect layer 535, as shown in FIG. 5B, while the interconnect layers 475-510 representing the write word lines 365-380 may be formed at an M3 interconnect layer 540, as shown in FIG. 5C. In some embodiments, M2 interconnect layers 545 (see FIGS. 5B and 5C) may be used to connect the M1 layer to the M3 layer. In other embodiments, other levels of the interconnect layers for the first read bit lines 330 and 345, the second read bit lines 335 and 350, the write bit lines 285 and 390, the ground connection, the read word lines 355 and 360, and/or the write word lines 365-380.

Further, in some embodiments, to connect a gate structure to an interconnect layer or to connect one interconnect layer with another interconnect layer, an interconnect structure may be used. Interconnect structures are represented in FIGS. 5A-5C by the symbol "X." In some embodiments, one or more of the interconnect structures may be a via structure that provides an electrical connection between the gate structure and the M0 layer, between the M0 layer and the M1 layer, between the M1 layer and the M2 layer, and so on. In other embodiments, the interconnect structures may be other types of conductive structures that are suitable for connecting a gate structure to the M0 layer, the M0 layer to the M1 layer, the M1 layer to the M2 layer, and so on.

In some embodiments, the layout of each DRAM cell in the layout design 395 may have a height and width. In some embodiments, the layout may have a height, Y, in the Y-direction 260 and a width, X, in the X-direction 280. In layout designs of conventional DRAM arrays, a DRAM array configured in two columns and four rows may have a height of 4Y (e.g., due to four DRAM cells in four rows) and a width of 2X (e.g., due to two DRAM cells in two columns). In a similar configuration (e.g., two columns and four rows) of the DRAM array 315, the layout design 395 has a height of 2Y and a width of 4X due to the shared read word lines 355 and 360. Thus, the aspect ratio of a conventional layout design is different from that of the layout design 395. Therefore, compared to the layout design of conventional DRAM arrays, the layout design 395 has a height (e.g., 2Y) that is half the height (e.g., 4Y) of a conventional layout. Smaller height (Y) means smaller capacitance. Smaller capacitance means higher read current in the read bit lines. Therefore, the capacitance in the read bit lines of the DRAM array 315 having two read bit lines, with each read bit line being connected to about half of the DAM cells in a column, during a read operation is half (or about half) the capacitance of conventional DRAM arrays during a read operation. Thus, by reducing the height, Y, of the layout design 395, the capacitance in the read bit lines may be reduced and the read speed may be increased.

In some embodiments, the number of gate structures (e.g., polysilicon) in the M0 direction may be equal to the number of write word lines. For example, in some embodiments, the number of gate structures in height, 1Y, may be equal to two (e.g., see the layout design 395). Further, the number of write word lines in the same height, 1Y, may also be equal to two (e.g., from the DRAM array 315, it may be seen that the word lines 365 and 370 are in the height, 1Y, and the word lines 375 and 380 are in the same height, 1Y). Thus, in each height, 1Y, the number of the gate structures may be equal to the number of write word lines.

Figure 6A:
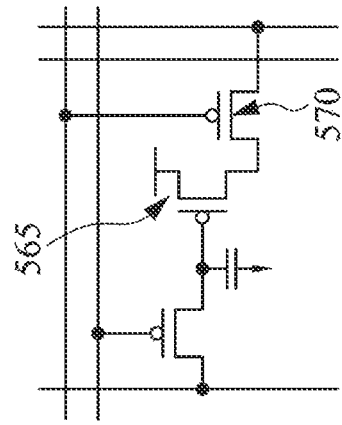
FIGS. 6A-6C are additional example configurations of the DRAM cell of FIG. 2, in accordance with some embodiments.
Figure 6B:
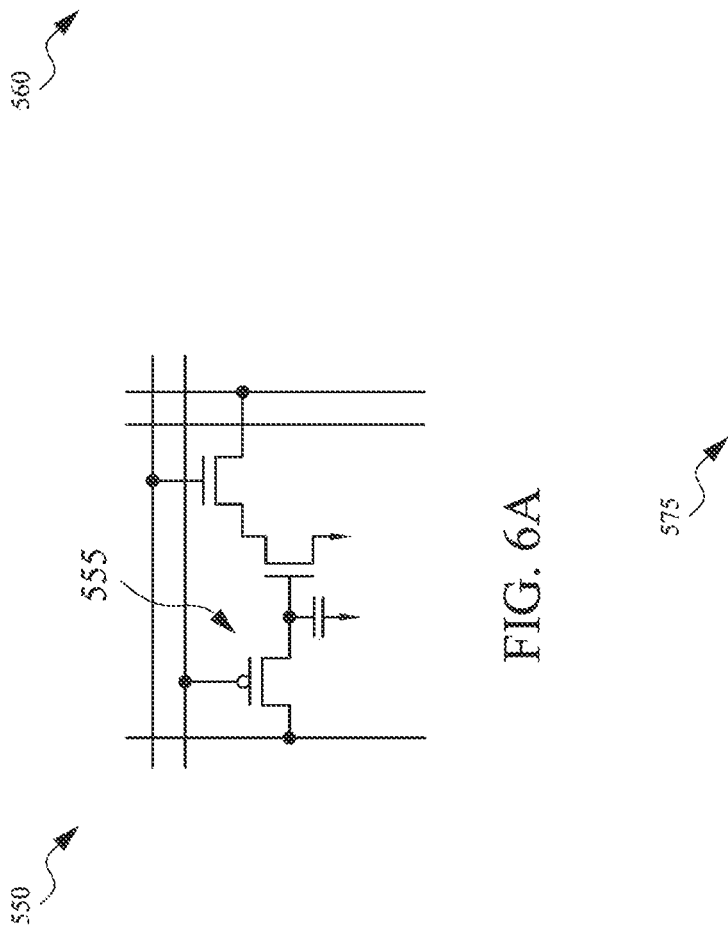
Figure 6C:
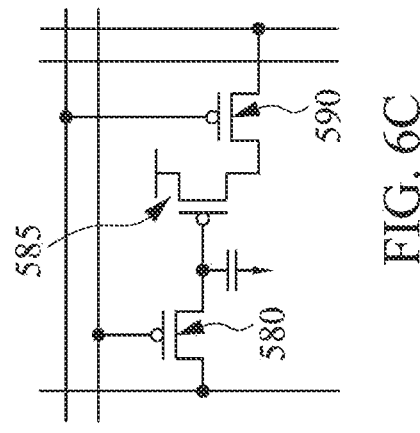

Referring now to FIGS. 6A-6C, various additional configurations of a DRAM cell are shown, in accordance with some embodiments of the present disclosure. FIG. 2 describes one example configuration of the DRAM cell 200. In the DRAM cell 200, the write pass gate transistor 210, the read pull down transistor 215, and the read pass gate transistor 230 are all n-type transistors. In some embodiments, one or more of the write pass gate transistor 210, the read pull down transistor 215, and the read pass gate transistor 230 may be configured as a p-type transistor. For example, FIG. 6A shows a DRAM cell 550 having a write pass gate transistor 555 of the p-type. Other than the write pass gate transistor 555 being of the p-type, the DRAM cell 550 is similar to the DRAM cell 200, and therefore, not described again. The DRAM cell 550 may have a similar layout design as the layout design 245 of the DRAM cell 200.

FIG. 6B shows a DRAM cell 560 having a read pull down transistor 565 and a read pass gate transistor 570 that are both of the p-type. Other than the read pull down transistor 565 and the read pass gate transistor 570 being of the p-type, the DRAM cell 560 is similar to the DRAM cell 200, and therefore, not described again. In some embodiments, either the read pull down transistor 565 or the read pass gate transistor 570 may be of the p-type. FIG. 6C shows a DRAM cell 575 having a write pass gate transistor 580, a read pull down transistor 585, and a read pass gate transistor 590, each of which is of the p-type. Other than the write pass gate transistor 580, the read pull down transistor 585, and the read pass gate transistor 590 being of the p-type, the DRAM cell 575 is similar to the DRAM cell 200, and therefore, not described again.

The DRAM cells 560 and 575 may each also have a similar layout as the layout design 245 of the DRAM cell 200 with a minor variation in the connection of the read pull down transistor 565 and 585 to the read pass gate transistor 570 and 590, respectively. For example, and referring to FIGS. 6B and 6C in conjunction with FIG. 3, instead of the local interconnect layer 300 connecting the drain terminal of the read pull down transistor to the read pass gate transistor, that local interconnect layer may now connect the source terminal of the read pull down transistor 565 and 585 to the read pass gate transistor 570 and 590, respectively, in some embodiments.

Each of the DRAM cells 550, 560, and 575 may be used in the DRAM array 315 instead of the DRAM cell 200. When used in the DRAM array 315, each of the DRAM cells 550, 560, and 575 may be configured as shown in FIG. 4 in which each column has two read bit lines, and a read word line that is shared by two consecutive DRAM cells in the same column.

Figure 7:
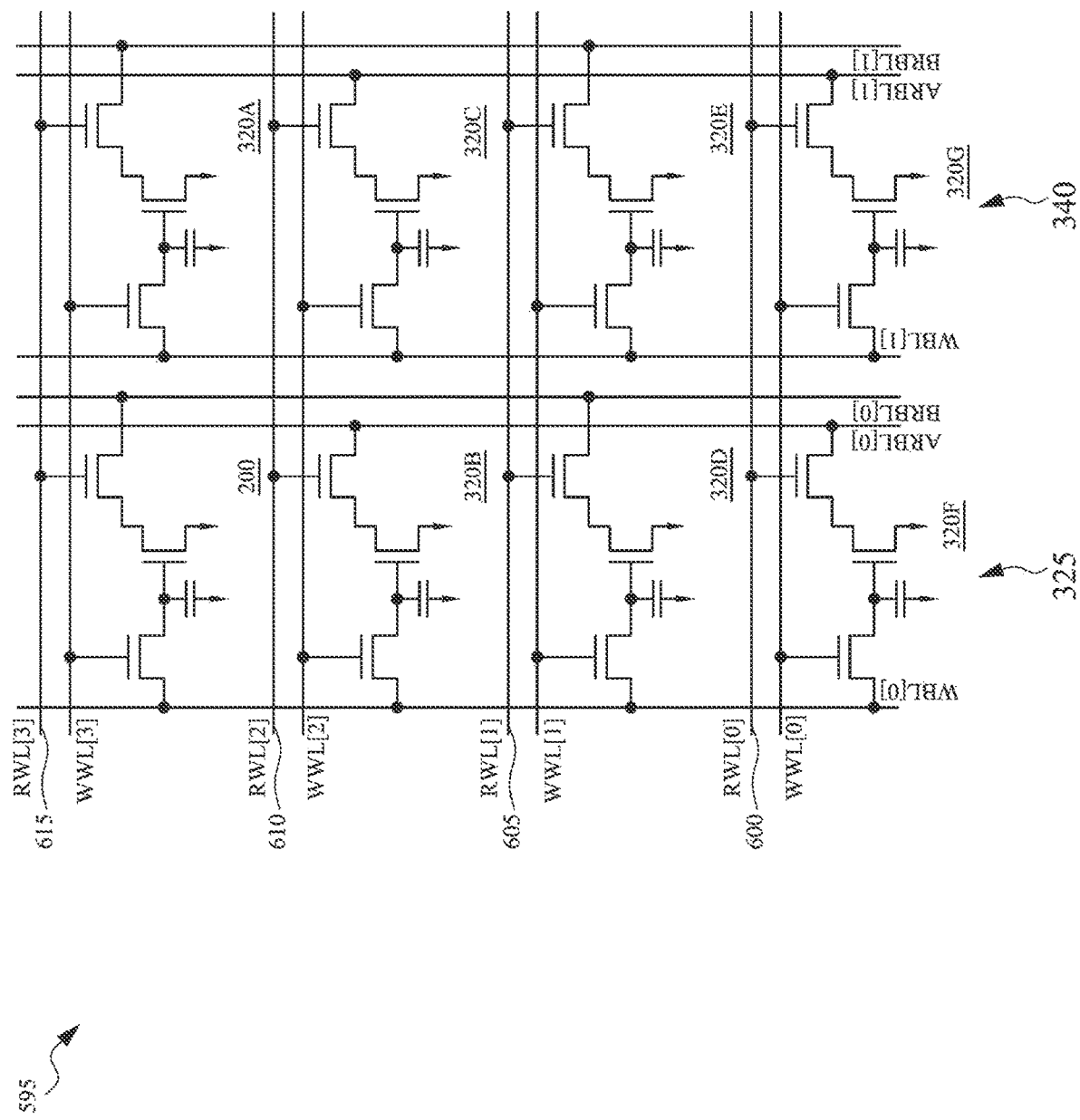
FIG. 7 is another example DRAM array, in accordance with some embodiments.

Turning to FIG. 7, an example of a DRAM array 595 is shown, in accordance with some embodiments of the present disclosure. The DRAM array 595 is similar to the DRAM 315 with the exception of how the read word lines 355 and 360 are connected. In the DRAM array 315, the read word line 355 is shared by the DRAM cells 320D and 320F in the first column 325, and by the DRAM cells 320E and 320G in the second column 340. Similarly, in the DRAM array 315, the read word line 360 is shared by the DRAM cells 200 and 320B in the first column 325, and by the DRAM cells 320A and 320C in the second column 340. However, in the DRAM array 595, each DRAM cell in a particular column has a separate read word line. In other words, DRAM cells in a column do not share read word lines. Thus, in the DRAM array 595, the DRAM cell 320F in the first column 325 and the DRAM cell 320G in the second column 340 are connected to a read word line 600, the DRAM cells 320D and 320E in the first and second columns, respectively, are connected to a read word line 605, the DRAM cells 320B and 320C in the first and second columns, respectively, are connected to a read word line 610, and the DRAM cells 200 and 320A in the first and second columns, respectively, are connected to a read word line 615. Additional routing resources may be needed in the DRAM array 595 for the separate read word lines relative to the configuration of the DRAM array 315. However, the DRAM array 395 may still experience reduction in power consumption.

Other than the separate read word lines, the DRAM array 595 is configured similar to the DRAM array 315. Thus, the DRAM array 595 also includes first and second read bit lines in each column. Further, although the DRAM array 595 is shown with DRAM cells that are configured similar to the DRAM cell 200, in other embodiments, the DRAM array 595 may be configured such that at least one DRAM cell in the DRAM array is configured similar to the DRAM cells 550, 560, and/or 575.

Thus, the present disclosure provides a DRAM array that achieves a faster read operation compared to conventional DRAM arrays. In some embodiments, the DRAM array of the present disclosure achieves a faster read operation by reducing the capacitance in the read bit line during a read operation. In some embodiments, the DRAM array of the present disclosure reduces the capacitance in the read bit line by separating the single read bit line of a conventional DRAM array into two separate read bit lines in each column of the DRAM array. For example, a single read bit line may be divided into a first read bit line and a second read bit line in each column of the DRAM array of the present disclosure. The first read bit line may be connected to alternating DRAM cells in each column of the DRAM array. The second read bit line may be connected to the remaining alternating DRAM cells in each column of the DRAM array. In some embodiments, one read word line may be shared by two DRAM cells in a column of the DRAM array. Specifically, in some embodiments, two consecutive DRAM cells (e.g., DRAM cells that are connected to different read bit lines) in a column may be connected to the same read word line. By sharing read word lines and separating the single read bit line into two read bit lines in each column, the present disclosure reduces the capacitance in each read bit line, thereby reducing the overall capacitance and increasing the read current in the read bit line during a read operation.

In accordance with some aspects of the present disclosure, a memory device is disclosed. The memory device includes a memory array having a first memory cell in a first column of the memory array, a second memory cell in the first column of the memory array, a first read bit line extending in a column direction and connected to the first memory cell to read data from the first memory cell, and a second read bit line extending in the column direction and connected to the second memory cell to read data from the second memory cell.

In accordance with some other aspects of the present disclosure, a Dynamic Random Access Memory (DRAM) array is disclosed. The DRAM array includes a plurality of DRAM cells arranged along a plurality of rows and a plurality of columns. Each of the plurality of rows extends in a row direction and each of the plurality of columns extends in a column direction that is perpendicular to the row direction. The DRAM array also includes a first read bit line extending in the column direction and connected to a first set of DRAM cells of the plurality of DRAM cells such that the first set of DRAM cells are arranged along a first set of the plurality of rows in a first column of the plurality of columns and a second read bit line extending in the column direction and connected to a second set of DRAM cells of the plurality of DRAM cells such that the second set of DRAM cells are arranged along a second set of the plurality of rows in the first column. The DRAM array further includes a write bit line extending in the column direction and connected to each of the first set of DRAM cells in the first column and each of the second set of DRAM cells in the first column.

In accordance with yet other aspects of the present disclosure, a memory array is disclosed. The memory array includes a plurality of memory cells arranged along a plurality of rows and a first column of a plurality of columns. Each of the plurality of rows extends in a row direction and each of the plurality of columns extends in a column direction that is perpendicular to the row direction. The memory array further includes a first interconnect layer defining a first read bit line in a layout design of the memory array such that the first interconnect layer is connected to a first set of the plurality of memory cells, a second interconnect layer defining a second read bit line in the layout design of the memory array such that the second interconnect layer is connected to a second set of the plurality of memory cells, and a third interconnect layer defining a first read word line in the layout design of the memory array such that the third interconnect layer is connected to a first memory cell of the first set of the plurality of memory cells and a second memory cell of the second set of the plurality of memory cells.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory array comprising:
a plurality of memory cells arranged along a plurality of rows and a first column of a plurality of columns, wherein each of the plurality of rows extends in a row direction and each of the plurality of columns extends in a column direction that is perpendicular to the row direction;
a first interconnect layer defining a first read bit line in a layout design of the memory array, wherein the first interconnect layer is connected to a first set of the plurality of memory cells, and wherein the first set of the plurality of memory cells are arranged along a first set of the plurality of rows in the first column;
a second interconnect layer defining a second read bit line in the layout design, wherein the second interconnect layer is connected to a second set of the plurality of memory cells, and wherein the second set of the plurality of memory cells are arranged along a second set of the plurality of rows in the first column; and
a plurality of third interconnect layers extending in the row direction defining a plurality of read word lines in the layout design, wherein each of the plurality of read word lines is connected to one of the first set of the plurality of memory cells or one of the second set of the plurality of memory cells.

2. The memory array of claim 1, wherein each of the first interconnect layer and the second interconnect layer is a Metal 0 layer.

3. The memory array of claim 1, wherein each of the plurality of third interconnect layers is a Metal 1 layer.

4. The memory array of claim 1, further comprising a fourth interconnect layer defining a write word line in the layout design and connected to the first set of the plurality of memory cells and the second set of the plurality of memory cells, and wherein the fourth interconnect layer is a Metal 3 layer.

5. The memory array of claim 1, wherein the layout design of each of the plurality of memory cells has a height in the column direction, wherein each of the plurality of memory cells comprises a number of gate structures within the height, and wherein the number of gate structures within the height is equal to a number of write word lines within the height.

6. The memory array of claim 1, wherein each memory cell in the first set of the plurality of memory cells and the second set of the plurality of memory cells is a Dynamic Random Access Memory cell.

7. The memory array of claim 6, further comprising a plurality of fourth interconnect layers, each of the plurality of fourth interconnect layers defining a ground connection of a read pull down transistor of the Dynamic Random Access Memory cell in the layout design, wherein each of the plurality of fourth interconnect layers is a Metal 0 layer.

8. The memory array of claim 6, wherein the Dynamic Random Access Memory cell is a 3 transistor memory cell.

9. The memory array of claim 1, wherein the first set of the plurality of rows comprises first alternating rows of the plurality of rows, and wherein the second set of the plurality of rows comprises second alternating rows of the plurality of rows.

10. A memory array comprising:
  a plurality of memory cells arranged along a plurality of rows and a first column of a plurality of columns, wherein each of the plurality of rows extends in a row direction and each of the plurality of columns extends in a column direction that is perpendicular to the row direction;
  a first interconnect layer defining a first read bit line in a layout design of the memory array, wherein the first interconnect layer is connected to a first set of the plurality of memory cells, and wherein the first set of the plurality of memory cells are arranged along a first set of the plurality of rows in the first column;
  a second interconnect layer defining a second read bit line in the layout design, wherein the second interconnect layer is connected to a second set of the plurality of memory cells, and wherein the second set of the plurality of memory cells are arranged along a second set of the plurality of rows in the first column;
  a plurality of third interconnect layers extending in the row direction defining a plurality of read word lines in the layout design, wherein each of the plurality of read word lines is connected to one of the first set of the plurality of memory cells or one of the second set of the plurality of memory cells; and
  a fourth interconnect layer defining a write bit line in the layout design and extending in the column direction and connected to each of the first set of the plurality of memory cells in the first column and each of the second set of the plurality of memory cells in the first column.

11. The memory array of claim 10, wherein each memory cell in the first set of the plurality of memory cells and the second set of the plurality of memory cells is a Dynamic Random Access Memory cell.

12. The memory array of claim 11, wherein the Dynamic Random Access Memory cell is a 3 transistor memory cell.

13. The memory array of claim 11, further comprising a plurality of fifth interconnect layers, each of the plurality of fifth interconnect layers defining a ground connection of a read pull down transistor of the Dynamic Random Access Memory cell in the layout design.

14. The memory array of claim 13, wherein each of the first interconnect layer, the second interconnect layer, and each of the plurality of fourth interconnect layers is a Metal 0 layer.

15. The memory array of claim 10, further comprising a fifth interconnect layer defining a write word line in the layout design and connected to each of the first set of the plurality of memory cells and the second set of the plurality of memory cells.

16. A memory device comprising:
  a memory array comprising:
    a first memory cell in a first column of the memory array;
    a second memory cell, adjacent to the first memory cell, in the first column of the memory array;
    a first interconnect layer defining a first read bit line in a layout design of the memory array, wherein the first read bit line extends in a column direction and connected to the first memory cell to read data from the first memory cell; and
    a second interconnect layer defining a second read bit line in the layout design, wherein the second read bit line extends in the column direction and connected to the second memory cell to read data from the second memory cell,
    wherein the first memory cell is connected to a third interconnect layer defining a first read word line in the layout design, wherein the first read word line extends in a row direction; and
    wherein the second memory cell is connected to a fourth interconnect layer defining a second read word line in the layout design, wherein the second read word line extends in the row direction.

17. The memory device of claim 16, wherein each of the first memory cell and the second memory cell is a Dynamic Random Access Memory cell.

18. The memory device of claim 17, wherein the Dynamic Random Access Memory cell is a 3 transistor memory cell.

19. The memory device of claim 16, further comprising a plurality of fifth interconnect layers, each of the plurality of fifth interconnect layers defining a ground connection of a read pull down transistor of the Dynamic Random Access Memory cell in the layout design.

20. The memory device of claim 16, wherein the layout design of the first memory cell and the second memory cell has a height in the column direction, wherein each of the first memory cell and the second memory cell comprises a number of gate structures within the height, and wherein the number of gate structures within the height is equal to a number of write word lines within the height.

* * * * *